(12) United States Patent
Cheng

(10) Patent No.: US 11,127,933 B2
(45) Date of Patent: Sep. 21, 2021

(54) ARRAY SUBSTRATE AND METHOD FOR MANUFACTURING THE SAME, METHOD FOR REPAIRING ARRAY SUBSTRATE AND DISPLAY APPARATUS

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 60 days.

(21) Appl. No.: 16/604,870

(22) PCT Filed: Mar. 11, 2019

(86) PCT No.: PCT/CN2019/077670
§ 371 (c)(1),
(2) Date: Oct. 11, 2019

(87) PCT Pub. No.: WO2019/184693
PCT Pub. Date: Oct. 3, 2019

(65) Prior Publication Data
US 2020/0161593 A1 May 21, 2020

(30) Foreign Application Priority Data

Mar. 26, 2018 (CN) .......................... 201810252430.0

(51) Int. Cl.
*H01L 51/50* (2006.01)
*H01L 51/56* (2006.01)
(Continued)

(52) U.S. Cl.
CPC .......... *H01L 51/56* (2013.01); *H01L 27/3248* (2013.01); *H01L 27/3258* (2013.01);
(Continued)

(58) Field of Classification Search
CPC ............. H01L 51/0009; H01L 51/0096; H01L 51/502; H01L 51/5203; H01L 51/5209;
(Continued)

(56) References Cited

U.S. PATENT DOCUMENTS

2006/0178072 A1* 8/2006 Konda .................... H01L 51/56
445/3
2007/0120476 A1* 5/2007 Park ..................... H01L 27/1248
313/506
(Continued)

FOREIGN PATENT DOCUMENTS

CN 102176093 A 9/2011
CN 104659055 A 5/2015
(Continued)

*Primary Examiner* — Mary A Wilczewski
(74) *Attorney, Agent, or Firm* — Nath, Goldberg & Meyer; Joshua B. Goldberg

(57) ABSTRACT

An array substrate and a method for manufacturing the same, a method for repairing an array substrate, and a display apparatus are provided. The array substrate includes a base substrate and pixel units above the base substrate, each pixel unit includes a light emitting device, the light emitting device includes a first electrode and a second electrode, at least one pixel unit is provided with a repair structure, the repair structure includes a first part and a second part mutually insulated, the first part and the second part are electrically coupled after being repaired, the first part is electrically coupled to the first electrode of the light emitting device in the pixel unit where the repair structure is located, the second part is electrically coupled to the first electrode of the light emitting device in any pixel unit other than the pixel unit where the repair structure is located.

20 Claims, 8 Drawing Sheets

(51) Int. Cl.
*H01L 27/32* (2006.01)
*H01L 51/00* (2006.01)

(52) U.S. Cl.
CPC ...... *H01L 27/3262* (2013.01); *H01L 51/0009* (2013.01); *H01L 51/0096* (2013.01); *H01L 51/502* (2013.01); *H01L 2251/568* (2013.01)

(58) Field of Classification Search
CPC ..... H01L 51/5225; H01L 51/42; H01L 51/56; H01L 2251/568; H01L 27/124; H01L 27/32; H01L 27/326; H01L 27/3248; H01L 27/3258; H01L 27/3262; Y02E 10/549; G02F 1/136259
See application file for complete search history.

(56) References Cited

U.S. PATENT DOCUMENTS

| | | | |
|---|---|---|---|
| 2007/0126006 A1 | 6/2007 | Lin | |
| 2012/0064641 A1* | 3/2012 | Yang | H01L 27/1259 438/4 |
| 2015/0144904 A1* | 5/2015 | Jeong | H01L 27/3272 257/40 |

FOREIGN PATENT DOCUMENTS

| | | | | |
|---|---|---|---|---|
| KR | 2006-005012 | * | 1/2006 | ....... H01L 2251/568 |
| KR | 2012-041889 | * | 5/2012 | ....... H01L 2251/568 |

* cited by examiner

|  | First column | Second column | ...... | jth column |
|---|---|---|---|---|
| First row | $K_{11}$ | $K_{12}$ | ...... | $K_{1j}$ |
| Second row | $K_{21}$ | $K_{22}$ | ...... | $K_{2j}$ |
| Third row | $K_{31}$ | $K_{32}$ | ...... | $K_{3j}$ |
| ⋮ | ⋮ | ⋮ | ...... | ⋮ |
| ith row | $K_{i1}$ | $K_{i2}$ | ...... | $K_{ij}$ |

A-A'

B-B'

ARRAY SUBSTRATE AND METHOD FOR MANUFACTURING THE SAME, METHOD FOR REPAIRING ARRAY SUBSTRATE AND DISPLAY APPARATUS

This is a National Phase Application filed under 35 U.S.C. 371 as a national stage of PCT/CN2019/077670, filed Mar. 21, 2019, an application claiming the benefit of Chinese Patent Application No. 201810252430.0, filed on Mar. 26, 2018, the content of each of which is hereby incorporated by reference in its entirety.

CROSS-REFERENCE TO RELATED APPLICATIONS

The present application claims the priority of Chinese Patent Application No. 201810252430.0, filed on Mar. 26, 2018, the contents of which are incorporated herein in their entirety by reference.

TECHNICAL FIELD

The present disclosure relates to the field of display technology, and in particular to an array substrate, a method for manufacturing the array substrate, a method for repairing an array substrate, and a display apparatus.

BACKGROUND

Quantum Dots are also known as semiconductor nanocrystals, and can emit colored light, whose color is determined by compositions, sizes, and shapes of the Quantum Dots, when stimulated by light or electricity. Quantum dot light emitting devices (QLEDs) are an important breakthrough in the field of display in recent years, and work on the same electroluminescence principle as organic light emitting devices (OLEDs). Novel display substrates such as Organic Light Emitting Device (OLED) display substrates and quantum dot light emitting device (QLED) display substrates have received wide attention from people due to characteristics of impact resistance, strong shock resistance, light weight, small size, more convenience in carrying and the like.

SUMMARY

An embodiment of the present disclosure provides an array substrate, which includes a base substrate and a plurality of pixel units above the base substrate, each of the pixel units includes a light emitting device, and the light emitting device includes a first electrode and a second electrode, at least one of the pixel units is provided with a repair structure therein, the repair structure includes a first part and a second part which are mutually insulated, and the first part and the second part are electrically coupled to each other after being repaired, the first part of the repair structure is electrically coupled to the first electrode of the light emitting device in the pixel unit where the repair structure is located, and the second part of the repair structure is electrically coupled to the first electrode of the light emitting device in any one of the pixel units other than the pixel unit in which the repair structure is located.

In some implementations, the pixel unit further includes a driving transistor, a drain of the driving transistor is coupled to the first electrode of the light emitting device in the pixel unit where the driving transistor is located, and the first part of the repair structure is electrically coupled to the first electrode of the light emitting device in the pixel unit where the repair structure is located, through the drain of the driving transistor.

In some implementations, the second part of the repair structure is electrically coupled to the first electrode of the light emitting device in the pixel unit adjacent to the pixel unit where the repair structure is located.

In some implementations, the second part of the repair structure in the pixel unit in $i^{th}$ row and $j^{th}$ column is electrically coupled to the first electrode of the light emitting device in the pixel unit in $(i+1)^{th}$ row and $j^{th}$ column, i and j are integers, and i≥1, j≥1.

In some implementations, the second part of the repair structure in the pixel unit in $i^{th}$ row and $j^{th}$ column is electrically coupled to the first electrode of the light emitting device in the pixel unit in $(i-1)^{th}$ row and $j^{th}$ column, i and j are integers, and i≥2, j≥1.

In some implementations, the second part of the repair structure in the pixel unit in $i^{th}$ row and $j^{th}$ column is electrically coupled to the first electrode of the light emitting device in the pixel unit in $i^{th}$ row and a $(j+1)^{th}$ column, i and j are integers, and i≥1, j≥1.

In some implementations, the second part of the repair structure in the pixel unit in $i^{th}$ row and $j^{th}$ column is electrically coupled to the first electrode of the light emitting device in the pixel unit in $i^{th}$ row and $(j-1)^{th}$ column, i and j are integers, and i≥1, j≥2.

In some implementations, the second part of the repair structure in the pixel unit in $i^{th}$ row and $j^{th}$ column is electrically coupled to the first electrode of the light emitting device in the pixel unit in $(i+1)^{th}$ row and $(j+1)^{th}$ column, i and j are integers, and i≥1, j≥1.

In some implementations, the second part of the repair structure in the pixel unit in $i^{th}$ row and $j^{th}$ column is electrically coupled to the first electrode of the light emitting device in the pixel unit in the $(i+1)^{th}$ row and the $(j-1)^{th}$ column, i and j are integers, and i≥1, j≥2.

In some implementations, the second part of the repair structure in the pixel unit in $i^{th}$ row and $j^{th}$ column is electrically coupled to the first electrode of the light emitting device in the pixel unit in $(i-1)^{th}$ row and $(j-1)^{th}$ column, i and j are integers, and i≥2, j≥2.

In some implementations, the second part of the repair structure in the pixel unit in $i^{th}$ row and $j^{th}$ column is electrically coupled to the first electrode of the light emitting device in the pixel unit in $(i-1)^{th}$ row and $(j+1)^{th}$ column, i and j are integers, and i≥2, j≥1.

In some implementations, the first part of the repair structure and the drain of the driving transistor in the pixel unit where the repair structure is located are formed in one body.

In some implementations, the second part of the repair structure and the first electrode of the light emitting device in the pixel unit other than the pixel unit where the repair structure is located are formed in one body.

In some implementations, orthographic projections of the first part and the second part of the repair structure on the base substrate at least partially overlap with each other.

In some implementations, a position where the orthographic projections of the first part and the second part of the repair structure on the base substrate overlap with each other is located in a repair region, and an interlayer insulating layer is disposed between a layer where the first part is located and a layer where the second part is located.

In some implementations, the interlayer insulating layer includes a passivation layer and a planarization layer successively disposed above the base substrate, the passivation layer being above the layer where the drain of the driving transistor and the first part of the repair structure are located, a groove is formed in a position, corresponding to the repair region, of the planarization layer, and the groove penetrates through the planarization layer, a first via hole penetrating through the passivation layer and the planarization layer is formed in positions, corresponding to the drain of the driving transistor, of the passivation layer and the planarization layer, the first electrode of the light emitting device is coupled to the drain of the driving transistor through the first via hole.

In some implementations, the light emitting device includes an OLED device or a QLED device.

In some implementations, upon repairing by laser irradiation, a passageway is formed between overlapping portions of the first part and the second part of the repair structure, and melted portions of the first part and/or the second part of the repair structure are joined together through the passageway.

An embodiment of the present disclosure also provides a method for manufacturing an array substrate, the method including: forming a plurality of pixel units above a base substrate; forming a repair structure for at least one of the pixel units, a first part of the repair structure is electrically coupled to a first electrode of a light emitting device in the pixel unit where the repair structure is located, and a second part of the repair structure is electrically coupled to a first electrode of a light emitting device in the pixel unit other than the pixel unit where the repair structure is located; forming an interlayer insulating layer between the first part and the second part of the repair structure; the first part and the second part of the repair structure are capable of being electrically coupled to each other under irradiation of laser.

In some implementations, the method further includes: forming a driving transistor above the base substrate, a drain of the driving transistor is coupled to the first electrode of the light emitting device in the pixel unit where the driving transistor is located, and the first part of the repair structure is electrically coupled to the first electrode of the light emitting device in the pixel unit where the repair structure is located, through the drain of the driving transistor.

In some implementations, the second part of the repair structure is formed to be electrically coupled to the first electrode of the light emitting device in the pixel unit adjacent to the pixel unit where repair structure is located.

In some implementations, the first part of the repair structure and the drain of the driving transistor are formed in a same layer above the base substrate by a single patterning process.

In some implementations, the second part of the repair structure and the first electrode of the light emitting device in the pixel unit adjacent to the pixel unit where the repair structure is located are formed in a same layer by a single patterning process.

In some implementations, the first part and the second part of the repair structure are formed so that orthographic projections of the first part and the second part of the repair structure on the base substrate at least partially overlap with each other, and a position where the orthographic projections of the first part and the second part of the repair structure on the base substrate overlap with each other is located in a repair region.

In some implementations, the interlayer insulating layer includes a passivation layer and a planarization layer successively disposed above the base substrate, a groove is formed at a position of the planarization layer corresponding to the repair region, and the groove penetrates through the planarization layer, the method further includes: forming the passivation layer above a layer where the drain of the driving transistor and the first part of the repair structure are located; and forming the planarization layer above the passivation layer, and etching a via hole at a position of the planarization layer corresponding to the repair region to form the groove.

In some implementations, the method further includes: forming a first via hole penetrating through the passivation layer and the planarization layer at positions of the passivation layer and the planarization layer corresponding to the drain of the driving transistor while forming the groove, the first electrode of the light emitting device is electrically coupled to the drain of the driving transistor through the first via hole; the groove and the first via hole are formed by a single patterning process.

An embodiment of the present disclosure further provides a method for repairing the array substrate provided by the embodiment of the present disclosure, and the method includes: determining a pixel unit of the array substrate with display defect; and performing laser irradiation on the first part and the second part of the repair structure in the pixel unit with display defect so that the first part and the second part of the repair structure are electrically coupled to each other.

In some implementations, the performing laser irradiation on the first part and the second part of the repair structure in the pixel unit with display defect so that the first part and the second part of the repair structure are electrically coupled to each other includes: irradiating the first part and the second part of the repair structure in the pixel unit with display defect by laser, to gasify parts between overlapping portions of the first part and the second part of the repair structure, the first part and the second part of the repair structure are melted and joined together through a passageway formed by gasification.

An embodiment of the present disclosure also provides a display apparatus, including any of array substrates provided by embodiments of the present disclosure.

DESCRIPTION OF EMBODIMENTS

In order to make a person skilled in the art understand technical solutions of the present disclosure better, the technical solutions of the present disclosure will be described in detail below in conjunction with accompanying drawings and specific embodiments and implementations.

AMQLED or AMOLED displays have a wide application market. A pixel circuit of QLED or OLED device has a complicated structure, and defects are easily generated in process of manufacturing an array substrate, thus a repair design for the pixel circuit is very important.

An embodiment of the present disclosure provides an array substrate, which may include a base substrate, and a plurality of pixel units above the base substrate. Each pixel unit includes a light emitting device including a first electrode and a second electrode. At least one pixel unit is provided with a repair structure therein, the repair structure includes a first part and a second part which are mutually insulated, and the first part and the second part are electrically coupled to each other after being repaired. The first part of the repair structure is electrically coupled to the first electrode of the light emitting device in the pixel unit where the repair structure is located, and the second part of the repair structure is electrically coupled to the first electrode of the light emitting device in any pixel unit other than the pixel unit where the repair structure is located.

Since the repair structure is disposed in the pixel unit of the array substrate according to the embodiment of the disclosure, and the first part of the repair structure is electrically coupled to the first electrode of the light emitting device in the pixel unit where the repair structure is located, the second part of the repair structure is electrically coupled to the first electrode of the light emitting device in another pixel unit other than the pixel unit where the repair structure is located. When, for example, a problem occurs in a driving transistor in the pixel unit provided with the repair structure and a gray scale voltage cannot be transmitted to the first electrode of the light emitting device to drive the light emitting device to display, the first part and the second part of the repair structure in the pixel unit can be electrically coupled to each other by laser irradiation, and at this time, the gray scale voltage written to the first electrode of the light emitting device in the another pixel unit can be written to the first electrode of the light emitting device in the pixel unit where the repair structure is located through the repair structure, so that the pixel unit where the repair structure is located can emit light normally.

Figures 1, 2:
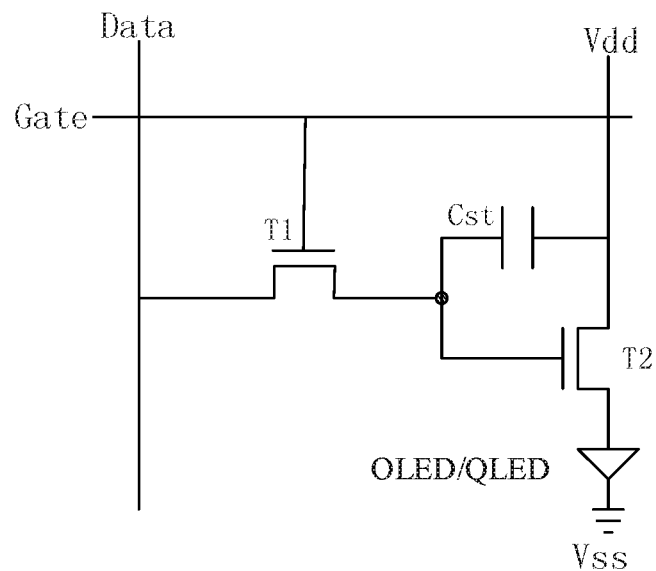
FIG. 1 is a schematic diagram of a pixel circuit in each pixel unit of an array substrate according to an embodiment of the disclosure.
FIG. 2 is a schematic structural diagram of an array substrate according to an embodiment of the disclosure.

As shown in FIG. 1 through 8, the array substrate provided by the embodiment of the present disclosure may include a base substrate 10, a plurality of gate lines Gate and a plurality of data lines Data above the base substrate 10, the gate lines Gate and the data lines Data being disposed to cross each other to define a plurality of pixel units (i.e., pixel units $K_{11}$ to $K_{ij}$ shown in FIG. 2). Each pixel unit includes a pixel circuit including a switching transistor T1, a driving transistor T2, and a light emitting device OLED/QLED. A drain 24 of the driving transistor T2 is coupled to a first electrode 51 of the light emitting device in the pixel unit where the driving transistor T2 is located.

Each pixel unit may be provided with a repair structure 4 therein. The repair structure 4 may include a first part 41 and a second part 42 which are mutually insulated, and the first part 41 and the second part 42 may be electrically coupled to each other under laser irradiation. The first part 41 of the repair structure 4 is electrically coupled to the drain 24 of the driving transistor T2 in the pixel unit where the repair structure 4 is located, and the first part 41 of the repair structure 4 is electrically coupled to the first electrode 51 of the light emitting device in the pixel unit where the repair structure 4 is located, through the drain 24 of the driving transistor T2. The second part 42 of the repair structure 4 is electrically coupled to the first electrode 51 of the light emitting device in another pixel unit other than the pixel unit where the repair structure 4 is located. For example, the second part 41 of the repair structure 4 may be electrically coupled to the first electrode 51 of the light emitting device in the pixel unit adjacent to the pixel unit where the repair structure 4 is located.

Since the repair structure 4 is disposed in the pixel unit of the array substrate of the present embodiment, the first part 41 of the repair structure 4 is electrically coupled to the drain 24 of the driving transistor T2 in the pixel unit where the repair structure 4 is located, and the second part 42 of the repair structure 4 is electrically coupled to the first electrode 51 of the light emitting device in the pixel unit adjacent to the pixel unit where the repair structure 4 is located. When the driving transistor T2 in the pixel unit provided with the repair structure 4 has a problem that the gray scale voltage cannot be transmitted to the first electrode 51 of the light emitting device to drive the light emitting device for display, the first part 41 and the second part 42 of the repair structure 4 in the pixel unit can be electrically coupled to each other by means of laser irradiation, so that the gray scale voltage written to the first electrode 51 of the light emitting device in the pixel unit adjacent to the pixel unit where the repair structure 4 is located can be written into the first electrode 51 of the light emitting device of the pixel unit where the repair structure 4 is located through the repair structure 4, therefore the pixel unit where the repair structure 4 is located can normally emit light.

It should be noted that, since brightness of pixel units in a display panel is gradually changed when the display panel displays a picture, gray scale information displayed by the pixel units adjacent to each other in a row or column direction is similar, thus, in the embodiment, the first part 41 and the second part 42 of the repair structure 4 in the pixel unit in which a problem occurs are electrically coupled to each other, so that a gray scale voltage written to the first electrode 51 of the light emitting device in the pixel unit adjacent to the pixel unit in which the problem occurs is written to the first electrode 51 of the light emitting device in the pixel unit in which the problem occurs through the repair structure 4, thereby the pixel unit in which the problem occurs can normally emit light, which does not affect a display effect of the display panel.

In some implementations, orthographic projections of the first part 41 and the second part 42 of each repair structure 4 on the base substrate at least partially overlap with each other, and overlapping portions of the first part 41 and the second part 42 form a repair region. The first part 41 of the repair structure 4 may be made of a material of at least one of molybdenum, molybdenum-niobium alloy, aluminum, aluminum-neodymium alloy, titanium, or copper. The second part 42 of the repair structure 4 may include an ITO (indium tin oxide)/Ag (silver)/ITO (indium tin oxide) layer structure or an. Ag (silver)/ITO (indium tin oxide) layer structure; alternatively, ITO in the above structure may be replaced with IZO (indium zinc oxide), IGZO (indium gallium zinc oxide), or InGaSnO (indium gallium tin oxide). Certainly, the second part 42 of the repair structure 4 may also be formed by using a material of inorganic metal oxide, organic conductive polymer or metal with conductive performance and high work function value, the inorganic metal oxide may include indium tin oxide or zinc oxide, the organic conductive polymer may include PEDOT:SS, PAM, and the metal may include gold, copper, silver or platinum. In this way, when laser is irradiated to the first part 41 and the second part 42 of the repair structure 4 in the repair region, a film layer part (such as passivation interlayer insulating layer) corresponding to the repair region between the first part 41 and the second part 42 of the repair structure 4 is gasified to form a passageway, portions of the first part 41 and the second part 42 of the repair structure 4 are in a molten state under laser irradiation, and melted portions of the first part 41 and the second part 42 of the repair structure 4 are joined together through the passageway to achieve electrical connection therebetween.

Following descriptions are given by taking orthographic projections of the first part 41 and the second part 42 of the repair structure 4 on the base substrate partially overlapping with each other as an example. The light emitting device in the array substrate of the embodiment may be an OLED device or a QLED device, but is not limited to these two light emitting devices, and other types of light emitting devices may also be used.

In order to more clearly describe a structure of the array substrate in the embodiment of the present disclosure, structures of array substrates of several implementations are explained below.

As shown in FIG. 1, the pixel circuit in the pixel unit is exemplified as a 2T1C pixel circuit, i.e., the pixel unit includes a driving transistor T2, a switching transistor. T1, a storage capacitor. Cst, and a light emitting device. A source of the switching transistor T1 is coupled to the data line Data, a drain of the switching transistor T1 is respectively coupled to a first end of the storage capacitor Cst and a gate of the driving transistor T2, and a gate of the switching transistor T1 is coupled to the gate line Gate. A source of the driving transistor T2 is respectively coupled to a first power supply voltage line Vdd and a second end of the storage capacitor Cst, a drain of the driving transistor. T2 is coupled to a first electrode of the light emitting device, and a gate of the driving transistor T2 is coupled to the first end of the storage capacitor Cst. A second electrode of the light emitting device is coupled to a second power supply voltage line Vss. Gates of switching transistors T1 in the pixel units in a same row are coupled to a same gate line Gate, and sources of switching transistors T1 in the pixel units in a same column are coupled to a same data line Data.

As an example structure of the array substrate, a first part of the repair structure in the pixel unit may be electrically coupled to the drain of the driving transistor T2 in the pixel unit where the repair structure is located, and the second part of the repair structure may be electrically coupled to the first electrode of the light emitting device in the pixel unit which is in the same column as and adjacent to the pixel unit where the repair structure is located.

Figure 3:
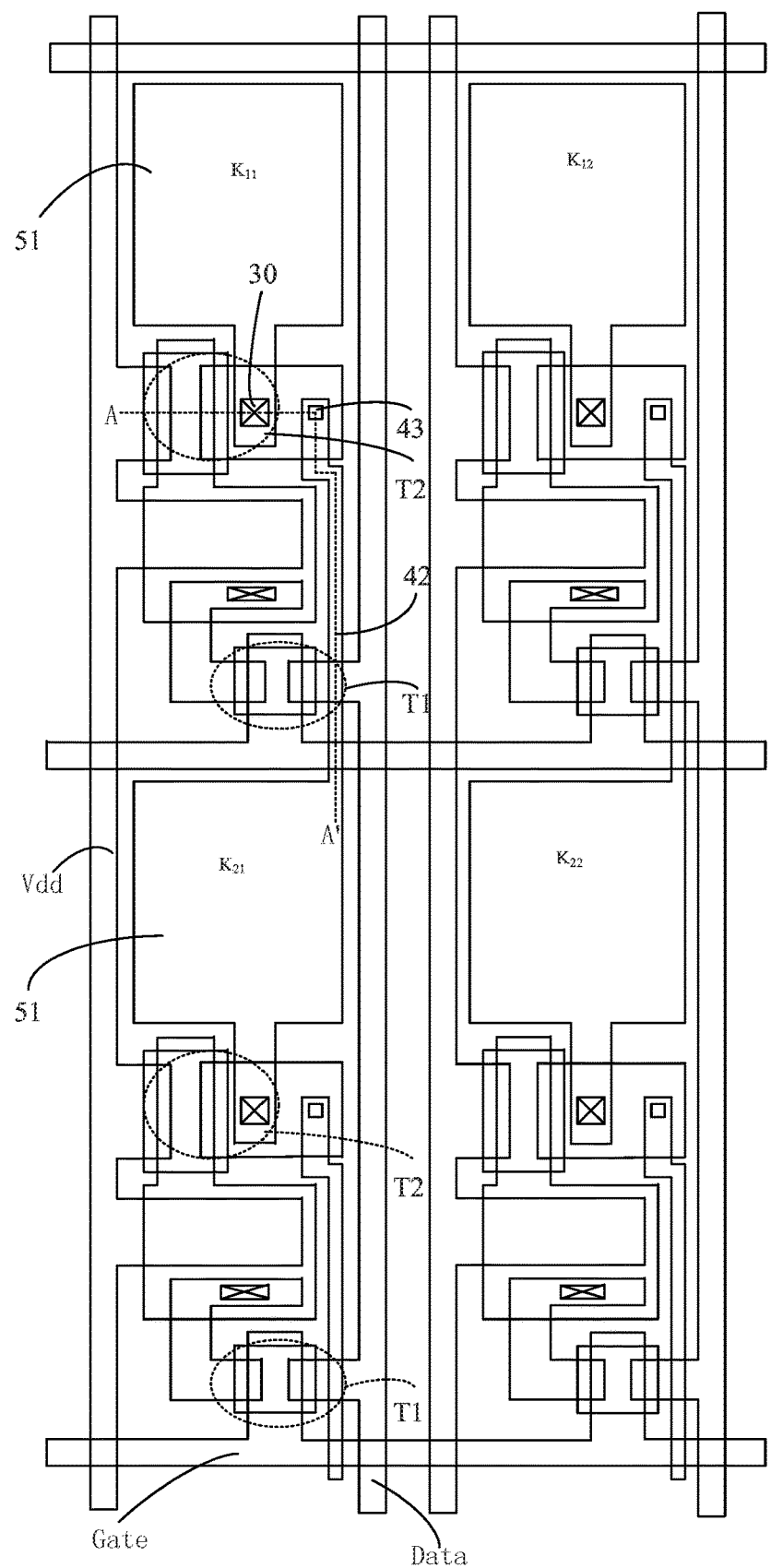
FIG. 3 is a top view of a structure of an array substrate according to an embodiment of the disclosure.
Figure 4:
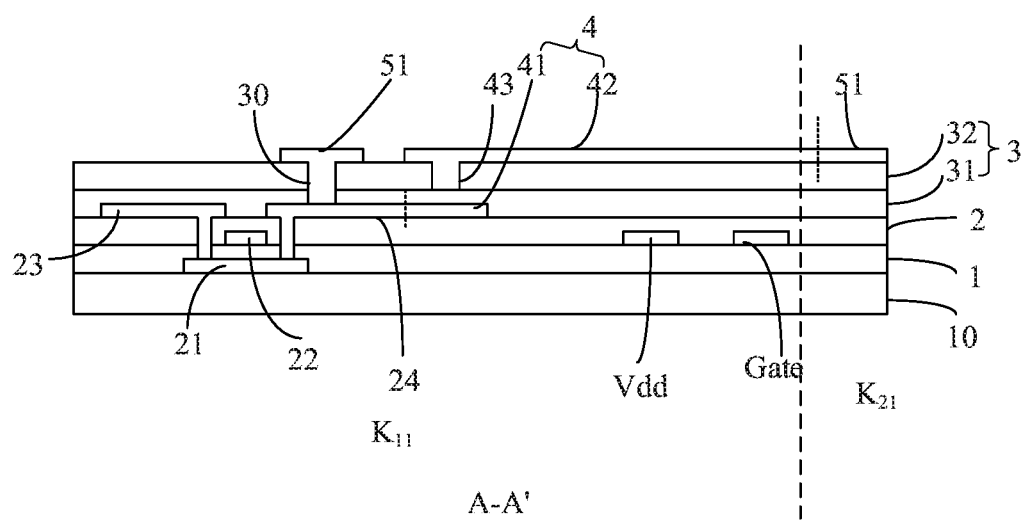
FIG. 4 is a cross-sectional view of the array substrate shown in FIG. 3 taken along line A-'t.

As shown in FIGS. 3 and 4, since the light emitting device, the driving transistor T2, the storage capacitor Cst, and the switching transistor T1 in the pixel unit of the array substrate are generally arranged one by one along the column direction, the second part 42 of the repair structure 4 in the pixel unit in the $i^{th}$ row and the $j^{th}$ column may be electrically coupled to the first electrode 51 of the light emitting device in the pixel unit in the $(i+1)^{th}$ row and the $j^{th}$ column, where i and j are integers, and i≥1, j≥1.

Specifically, taking i=1 and j=1 as an example, the pixel unit located in the first row and the first column is the pixel unit $K_{11}$, the pixel unit located in the second row and the first column is the pixel unit $K_{21}$, and the repair structure 4 in the pixel unit $K_{11}$ is taken as an example for description. The first part 41 of the repair structure 4 in the pixel unit $K_{11}$ may be electrically coupled to the drain 24 of the driving transistor T2 in the pixel unit $K_{11}$ and they are formed in one body, that is, the first part 41 of the repair structure 4 in the pixel unit $K_{11}$ may be disposed in the same layer and made of the same material as the drain 24 of the driving transistor T2 in the pixel unit $K_{11}$, and they may be formed by a single patterning process. The second part 42 of the repair structure 4 in the pixel unit $K_{11}$ may be electrically coupled to the first electrode 51 of the light emitting device in the pixel unit $K_{21}$ and they may be formed in one body, that is, the second part 42 of the repair structure 4 in the pixel unit $K_{11}$ may be disposed in the same layer and made of the same material as the first electrode 51 of the light emitting device in the pixel unit $K_{21}$, and the may be formed by a single patterning process. Therefore, the repair structure 4 is formed in the embodiment without increasing the process steps and the process cost.

The position where the orthographic projections of the first part 41 and the second part 42 of the repair structure 4 on the base substrate 10 overlap with each other is located in the repair region. Since the first part 41 of the repair structure 4 in the pixel unit $K_{11}$ is in the same layer as the drain 24 of the driving transistor T2 in the pixel unit $K_{11}$, and the second part 42 of the repair structure 4 in the pixel unit $K_{11}$ is in the same layer as the first electrode 51 of the light emitting device in the pixel unit $K_{21}$, an interlayer insulating layer 3 may be disposed between the first part 41 and the second part 42 of the repair structure 4.

For example, a passivation layer 31 and a planarization layer 32 may be successively disposed in the pixel unit between a layer where the source 23 and the drain 24 of the driving transistor T2 are located and a layer where the first electrode 51 of the light emitting device is located. At this time, a groove 43 may be etched at a position of the planarization layer 32 corresponding to the repair region, and a portion of the passivation layer 31 corresponding to the groove 43 is configured to be capable of being gasified by laser. When the first part 41 and the second part 42 of the repair structure 4 in the repair region are irradiated by laser, the portion of the passivation layer 31 corresponding to the groove 43 is gasified to form a passageway between the first part 41 and the second part 42 of the repair structure 4 with the groove 43, the laser melts at least portions of the first part 41 and the second part 42 of the repair structure 4, and melted portions of the first part and the second part of the repair structure are joined together through the passageway so that the first part 41 and the second part 42 of the repair structure 4 are electrically coupled.

Furthermore, since a first via hole 30 penetrating through the passivation layer 31 and the planarization layer 32 needs to be provided at positions of the passivation layer 31 and the planarization layer 32 corresponding to the drain 24 of the driving transistor T2 so as to couple the drain 24 of the driving transistor T2 to the first electrode 51 of the light emitting device in the pixel unit where the driving transistor T2 is located, the groove 43 in the repair region and the first via hole 30 may be formed by a single etching process, so that process steps are not increased.

It should be understood that, in the array substrate of the embodiment, the first part of the repair structure 4 and the drain 24 of the driving transistor T2 in the pixel unit of the $i^{th}$ row and the $j^{th}$ column may be formed in one body, and the second part of the repair structure 4 in the pixel unit of the $i^{th}$ row and the $j^{th}$ column is electrically coupled to the first electrode of the light emitting device in the pixel unit of the $(i-1)^{th}$ row and the $j^{th}$ column, where i and j are integers, and i≥2, j≥1.

Taking the repair structure 4 in the pixel unit $K_{21}$ where i=2 and j=1 as an example, the first part of the repair structure 4 in the pixel unit $K_{21}$ and the drain 24 of the driving transistor T2 in the pixel unit $K_{21}$ may be formed in one body, and the second part of the repair structure 4 in the pixel unit $K_{21}$ and the first electrode of the light emitting device in the pixel unit (i.e., the pixel unit $K_{11}$) in the first row and the first column may be formed in one body. Other structures of the array substrate are similar to those in the array substrate described above, and will not be described in detail herein.

Figure 5:
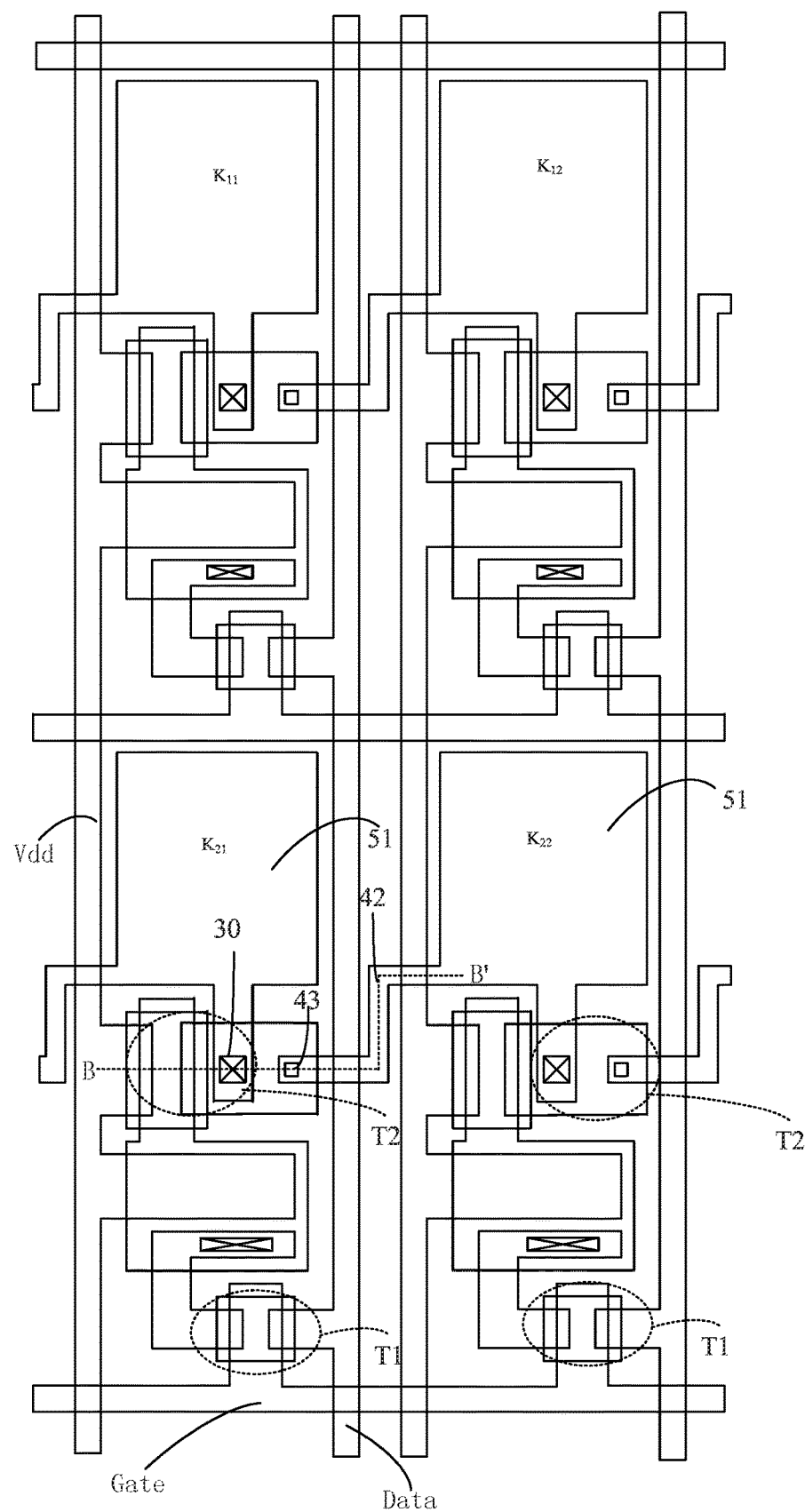
FIG. 5 is a top view of a structure of an array substrate according to an embodiment of the disclosure.
Figure 6:
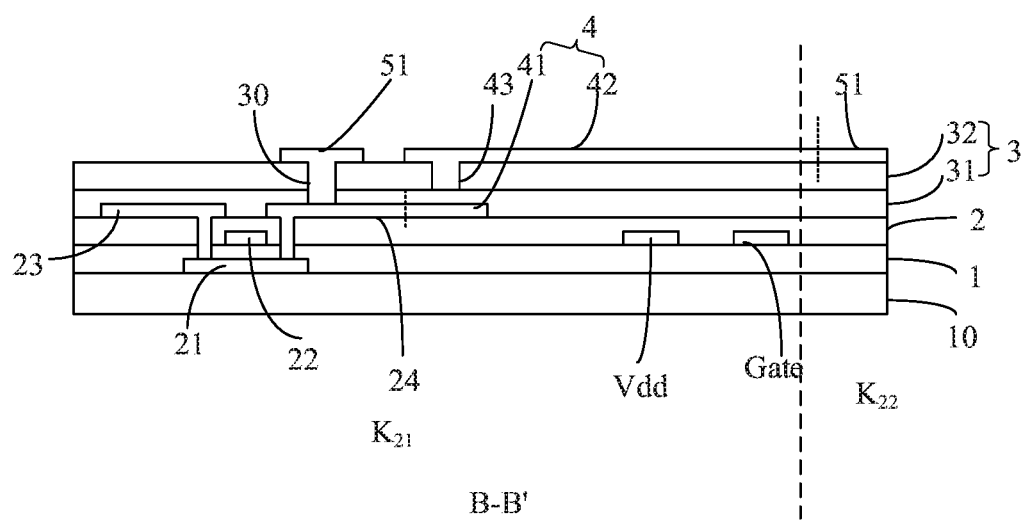
FIG. 6 is a cross-sectional view of the array substrate shown in FIG. 5 taken along line B-B'.

As another structure of the array substrate, as shown in FIGS. 5 and 6, the structure of each pixel unit of the array substrate is substantially the same as that described above with reference to FIGS. 3 and 4, except that in the array substrate shown in FIGS. 5 and 6, the second part 42 of the repair structure 4 is electrically coupled to the first electrode 51 of the light emitting device in the pixel unit which is in the same row as and adjacent to the pixel unit where the repair structure 4 is located.

In some implementations, the second part 42 of the repair structure 4 in the pixel unit in the $i^{th}$ row and the $j^{th}$ column is electrically coupled to the first electrode 51 of the light emitting device in the pixel unit in the $i^{th}$ row and the $(j+1)^{th}$ column, where i and j are integers, and i=1, j≤1.

Taking i=2 and j=1 as an example, the pixel unit located in the second row and the first column is the pixel unit $K_{21}$, the pixel unit located in the second row and the second column is the pixel unit $K_{22}$, and the repair structure 4 located in the pixel unit $K_{21}$ is taken as an example for description. The first part 41 of the repair structure 4 in the pixel unit $K_{21}$ may be electrically coupled to the drain 24 of the driving transistor T2 in the pixel unit $K_{21}$, and they are formed in one body, that is, the first part 41 of the repair structure 4 in the pixel unit $K_{21}$ and the drain 24 of the driving transistor T2 in the pixel unit $K_{21}$ are disposed in a same layer and made of a same material, and may be formed by a single patterning process. The second part 42 of the repair structure 4 in the pixel unit $K_{21}$ may be electrically coupled to the first electrode 51 of the light emitting device in the pixel unit $K_{22}$, and they may be formed in one body, that is, the second part 42 of the repair structure 4 in the pixel unit $K_{21}$ and the first electrode 51 of the light emitting device in the pixel unit $K_{22}$ are disposed in a same layer and made of a same material, and may be formed by a single patterning process. In the embodiment, the repair structure 4 is formed without increasing the process steps and the process cost.

The position where the orthographic projections of the first part 41 and the second part 42 of the repair structure 4 on the base substrate 10 overlap with each other is located in the repair region. Since the first part 41 of the repair structure 4 in the pixel unit $K_{21}$ is in the same layer as the drain 24 of the driving transistor T2 in the pixel unit $K_{21}$, and the second part 42 of the repair structure 4 in the pixel unit $K_{21}$ is in the same layer as the first electrode 51 of the driving transistor T2 in the pixel unit $K_{22}$, the interlayer insulating layer 3 may be disposed between the first part 41 and the second part 42 of the repair structure 4.

For example, the passivation layer 31 and the planarization layer 32 may be successively disposed in the pixel unit between a layer where the source 23 and the drain 24 of the driving transistor T2 are located and a layer where the first electrode 51 of the light emitting device is located. At this time, the groove 43 may be etched and formed at a position of the planarization layer 32 corresponding to the repair region, and when the first part 41 and the second part 42 of the repair structure 4 are electrically coupled by laser, the first part 41 and the second part 42 of the repair structure 4 may be in better contact with each other, and the implementation principle thereof is the same as that described above with reference to FIGS. 3 and 4, and will not be described again herein.

Furthermore, since the first via hole 30 penetrating through the passivation layer 31 and the planarization layer 32 needs to be provided at positions of the passivation layer 31 and the planarization layer 32 corresponding to the drain 24 of the driving transistor T2 so as to couple the drain 24 of the driving transistor T2 to the first electrode 51 of the light emitting device in the pixel unit where the driving transistor T2 is located, the groove 43 in the repair region and the first via hole 30 may be formed by a single etching process, so that process steps are not increased.

It should be understood that, in the array substrate of the embodiment, the first part of the repair structure 4 and the drain 24 of the driving transistor T2 in the pixel unit of the $i^{th}$ row and the $j^{th}$ column may be formed in one body, and the second part of the repair structure 4 in the pixel unit of the $i^{th}$ row and the $j^{th}$ column may be electrically coupled to the first electrode of the light emitting device in the pixel unit of the $i^{th}$ row and the $(j-1)^{th}$ column, where i and j are integers, and i≥1, j≥2.

Taking the repair structure 4 in the pixel unit $K_{22}$ of i=2 and j=2 as an example, the first part of the repair structure 4 in the pixel unit $K_{22}$ and the drain 24 of the driving transistor T2 in the pixel unit $K_{22}$ are formed in one body, and the second part of the repair structure 4 and the first electrode of the light emitting device in the pixel unit (i.e., the pixel unit $K_{21}$) in the second row and the first column are formed in one body. Other structures of the array substrate are similar to those in the array substrate described above, and will not be described in detail herein.

Figure 7:
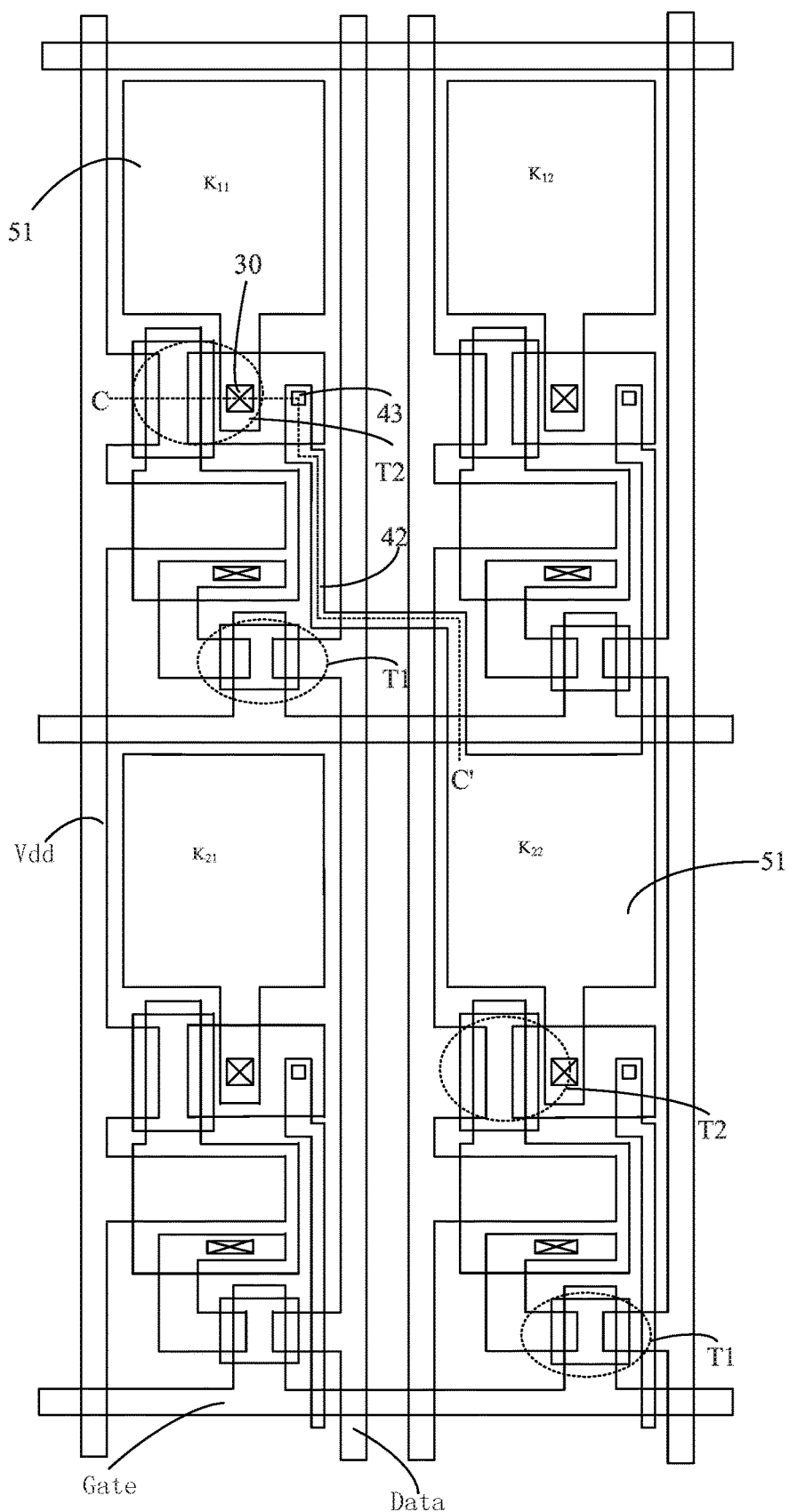
FIG. 7 is a top view of a structure of an array substrate according to an embodiment of the disclosure.
Figure 8:
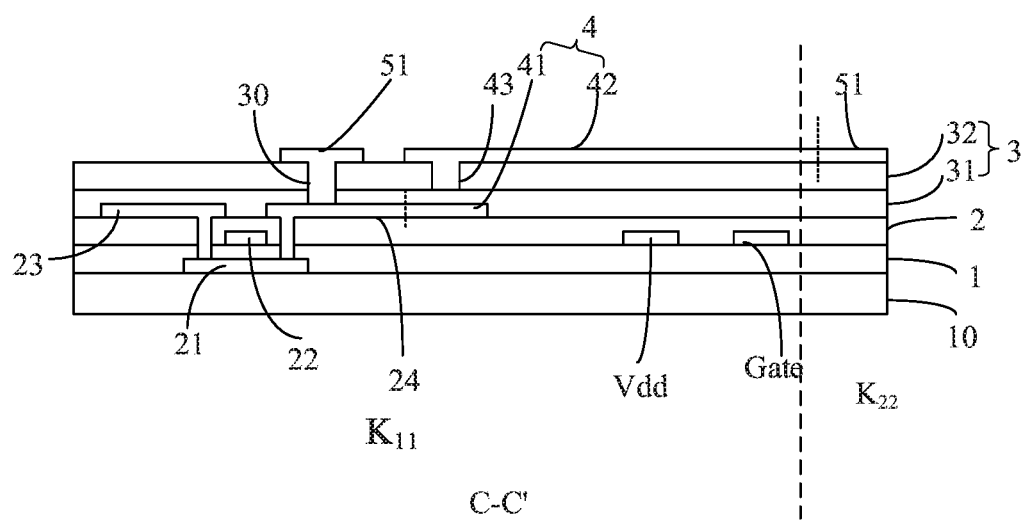
FIG. 8 is a cross-sectional view of the array substrate shown in FIG. 7 taken along line C-C'.

As still another structure of the array substrate in the embodiment, as shown in FIGS. 7 and 8, the structure of each pixel unit in the array substrate is substantially the same as that described above with reference to FIGS. 3 and 4, except that in the array substrate shown in FIGS. 7 and 8, the second part 42 of the repair structure 4 is electrically coupled to the first electrode 51 of the light emitting device in an adjacent pixel unit in the row next to the row where the repair structure 4 is located and in the column next to the column where the repair structure 4 is located, or is electrically coupled to the first electrode 51 of the light emitting device in an adjacent pixel unit in the row next to the row where the repair structure 4 is located and in the column previous to the column where the repair structure 4 is located.

For example, the second part of the repair structure 4 in the pixel unit of the $i^{th}$ row and the $j^{th}$ column is electrically coupled to the first electrode of the light emitting device in the pixel unit of the $(i+1)^{th}$ row and the $(j+1)^{th}$ column, where i and j are integers, and i≥1, j≥1.

Taking i=1 and j=1 as examples, the pixel unit located in the first row and the first column is the pixel unit $K_{11}$, the pixel unit located in the second row and the second column is the pixel unit $K_{22}$, and the repair structure 4 in the pixel unit $K_{11}$ is taken as an example for description.

The first part 41 of the repair structure 4 in the pixel unit $K_{11}$ may be electrically coupled to the drain 24 of the driving transistor T2 in the pixel unit $K_{11}$, and they are formed in one body, that is, the first part 41 of the repair structure 4 in the pixel unit $K_{11}$ and the drain 24 of the driving transistor T2 in the pixel unit $K_{11}$ are disposed in a same layer and made of a same material, and they may be formed by a single patterning process. The second part 42 of the repair structure 4 may be electrically coupled to the first electrode 51 of the light emitting device in the pixel unit $K_{22}$, and they may be formed in one body, that is, the second part 42 of the repair structure 4 in the pixel unit $K_{11}$ and the first electrode 51 of the light emitting device in the pixel unit $K_{22}$ are disposed in a same layer and made of a same material, and they may be formed by a single patterning process. Therefore, the repair structure 4 is formed in the embodiment without increasing the process steps and the process cost.

The position where the orthographic projections of the first part 41 and the second part 42 of the repair structure 4 on the base substrate 10 overlap with each other is located in the repair region. Since the first part 41 of the repair structure 4 in the pixel unit $K_{11}$ is in the same layer as the drain 24 of the driving transistor T2 in the pixel unit $K_{11}$, and the second part 42 of the repair structure 4 in the pixel unit $K_{11}$ is in the same layer as the first electrode 51 of the light emitting device in the pixel unit $K_{22}$, the interlayer insulating layer 3 may be disposed between the first part 41 and the second part 42 of the repair structure 4.

For example, the passivation layer 31 and the planarization layer 32 may be successively disposed in the pixel unit between a layer where the source and drains 24 of the driving transistors T2 are located and a layer where the first electrode 51 of the light emitting device is located. At this time, the groove 43 may be etched and formed at a position of the planarization layer 32 corresponding to the repair region, and when the first part 41 and the second part 42 of the repair structure 4 are electrically coupled by laser, the first part 41 and the second part 42 of the repair structure 4 may be in better contact with each other, and the implementation principle thereof is the same as that described above with reference to FIGS. 3 and 4, and will not be described again herein.

Furthermore, since the first via hole 30 penetrating through the passivation layer 31 and the planarization layer 32 needs to be provided at positions of the passivation layer 31 and the planarization layer 32 corresponding to the drain 24 of the driving transistor T2 so as to couple the drain 24 of the driving transistor T2 to the first electrode 51 of the light emitting device in the pixel unit where the driving transistor T2 is located, the groove 43 in the repair region and the first via hole 30 may be formed in a single etching process, so that process steps are not increased.

It should be understood that, in the array substrate of the embodiment, the second part of the repair structure in the pixel unit of the $i^{th}$ row and the $j^{th}$ column may be electrically coupled to the first electrode of the light emitting device in the pixel unit of the $(i+1)^{th}$ row and the $(j-1)^{th}$ column, where i and j are integers, and i≥1, j≥2.

Taking the repair structure 4 in the pixel unit $K_{22}$ where i=2 and j=2 as an example, the first part of the repair structure 4 in the pixel unit $K_{22}$ and the drain 24 of the driving transistor T2 in the pixel unit $K_{22}$ are formed in one body, and the second part of the repair structure 4 in the pixel unit $K_{22}$ and the first electrode of the light emitting device in the pixel unit (i.e., the pixel unit $K_{31}$) in the third row and the first column are formed in one body. Other structures of the array substrate are similar to those in the array substrate described above, and will not be described in detail herein.

As yet another structure of the array substrate of the embodiment, it is similar to that described with reference to FIGS. 3 and 4, and the difference is in that, the second part 42 of the repair structure 4 is electrically coupled to the first electrode 51 of the light emitting device in an adjacent pixel unit in the row previous to the row where the repair structure 4 is located and in the column next to the column where the repair structure 4 is located, or is electrically coupled to the first electrode 51 of the light emitting device in an adjacent pixel unit in the row previous to the row where the repair structure 4 is located and in the column next to the column where the repair structure 4 is located.

For example, the second part of the repair structure in the pixel unit in the $i^{th}$ row and the $j^{th}$ column is electrically coupled to the first electrode of the light emitting device in the pixel unit in the $(i-1)^{th}$ row and the $(j+1)^{th}$ column, where i and j are integers, and i≥2, j≥1.

The pixel unit in the second row and the first column is the pixel unit $K_{21}$, and the pixel unit in first row and the second column is the pixel unit $K_{12}$, and the repair structure 4 in the pixel unit $K_{21}$ is taken as an example for description.

The first part 41 of the repair structure 4 in the pixel unit $K_{21}$ may be electrically coupled to the drain 24 of the driving transistor T2 in the pixel unit $K_{21}$, and they are formed in one body, that is, the first part 41 of the repair structure 4 in the pixel unit $K_{21}$ and the drain 24 of the driving transistor T2 in the pixel unit $K_{21}$ are disposed in a same layer and made of a same material, and they may be formed by a single patterning process. The second part 42 of the repair structure 4 in the pixel unit $K_{21}$ may be electrically coupled to the first electrode 51 of the light emitting device in the pixel unit $K_{12}$, and they may be formed in one body, that is, the second part 42 of the repair structure 4 in the pixel unit $K_{21}$ and the first electrode 51 of the light emitting device in the pixel unit $K_{12}$ are disposed in a same layer and made of a same material, and they may be formed by a single patterning process. Therefore, the repair structure 4 is formed in the embodiment without increasing the process steps and the process cost.

The position where the orthographic projections of the first part 41 and the second part 42 of the repair structure 4 on the base substrate 10 overlap with each other is located in the repair region. Since the first part 41 of the repair structure 4 in the pixel unit $K_{21}$ is in the same layer as the drain 24 of the driving transistor T2 in the pixel unit $K_{21}$, and the second part 42 of the repair structure 4 in the pixel unit $K_{21}$ is in the same layer as the first electrode 51 of the light emitting device in the pixel unit $K_{12}$, the interlayer insulating layer 3 may be disposed between the first part 41 and the second part 42 of the repair structure 4.

For example, the passivation layer 31 and the planarization layer 32 may be successively disposed in the pixel unit between a layer where the source 23 and the drain 24 of the driving transistor T2 are located and a layer where the first electrode 51 of the light emitting device is located. At this time, the groove 43 may be etched and formed at a position of the planarization layer 32 corresponding to the repair region, and when the first part 41 and the second part 42 of the repair structure 4 are electrically coupled by laser, the first part 41 and the second part 42 of the repair structure 4 may be in better contact with each other, and the implementation principle thereof is the same as that described above with reference to FIGS. 3 and 4, and will not be described again herein.

Furthermore, since the first via hole 30 penetrating through the passivation layer 31 and the planarization layer 32 needs to be provided at positions of the passivation layer 31 and the planarization layer 32 corresponding to the drain 24 of the driving transistor T2 so as to couple the drain 24 of the driving transistor T2 to the first electrode 51 of the light emitting device in the pixel unit where the driving transistor T2 is located, the groove 43 in the repair region and the first via hole 30 may be formed by a single etching process, so that process steps are not increased.

It should be understood that, in the array substrate of the embodiment, the second part of the repair structure in the pixel unit of the $i^{th}$ row and the $j^{th}$ column may also be electrically coupled to the first electrode of the light emitting device in the pixel unit of the $(i-1)^{th}$ row and the $(j-1)^{th}$ column, where i and j are integers, and i≥2, j≥2.

Taking the repair structure 4 in the pixel unit $K_{22}$ where i=2 and j=2 as an example, the first part of the repair structure 4 in the pixel unit $K_{22}$ and the drain 24 of the driving transistor T2 in the pixel unit $K_{22}$ are formed in one body, and the second part of the repair structure 4 in the pixel unit $K_{22}$ and the first electrode of the light emitting device in the pixel unit (i.e., the pixel unit $K_{11}$) in the first row and the first column are formed in one body. Other structures of the array substrate are similar to those in the array substrate described above, and will not be described in detail herein.

It should be noted that all of the above implementations are examples of the second part 42 of the repair structure 4 being electrically coupled to the first electrode 51 of the light emitting device in the pixel unit adjacent to the pixel unit where the repair structure 4 is located, and the second part 42 of the repair structure 4 may also be electrically coupled to the first electrode 51 of the light emitting device in any other pixel unit non-adjacent to the pixel unit where the repair structure 4 is located, except for the pixel unit where the repair structure 4 is located, and the structure and the implementation principle are similar to those described above, and thus will not be described again herein.

An embodiment of the present disclosure also provides a method for repairing the array substrate described above, and the method includes following steps 1 and 2.

At step 1, a pixel unit with display defect of the array substrate is determined.

In this step, the pixel unit with display defect may be determined by a lighting test, and for example, if the light emitting device in a certain pixel unit is found not to emit light, the pixel unit is determined to be the pixel unit with display defect.

At step 2, laser irradiation is performed on the first part 41 and the second part 42 of the repair structure 4 in the pixel unit with display defect so as to electrically couple the first part 41 and the second part 42 of the repair structure. Thus, a gray scale voltage written to the first electrode 51 of the light emitting device in another pixel unit can be written to the first electrode 51 of the light emitting device of the pixel unit, where the repair structure 4 is located, through the repair structure 4, so that the pixel unit where the repair structure 4 is located can normally emit light, thereby the array substrate is repaired.

For example, when the orthographic projections of the first part 41 and the second part 42 of the repair structure 4 on the base substrate at least partially overlap with each other, overlapping portions of the first part 41 and the second part 42 of the repair structure 4 may be directly irradiated by laser, so that the first part 41 and the second part 42 of the repair structure 4 are joined together, and the first part 41 and the second part 42 of the repair structure 4 are electrically coupled.

For example, the first part 41 and the second part 42 of the repair structure in the pixel unit with display defect are irradiated with laser, a part between overlapping portions of the first part 41 and the second part 42 of the repair structure is gasified, and portions of the first part 41 and the second part 42 of the repair structure are melted and joined through a passageway formed by the gasification, thereby achieving electrical coupling of the first part 41 and the second part 42 of the repair structure.

Since the repair structure 4 is disposed in the pixel unit of the array substrate of the embodiment, and the first part 41 of the repair structure 4 is electrically coupled to the drain 24 of the driving transistor T2 in the pixel unit where the repair structure 4 is located, the second part 42 of the repair structure 4 is electrically coupled to the first electrode 51 of the light emitting device in another pixel unit other than the pixel unit where the repair structure 4 is located. When the driving transistor T2 in the pixel unit where the repair structure 4 is located has a problem and cannot transmit the gray scale voltage to the first electrode 51 of the light emitting device to drive the light emitting device to display, the first part 41 and the second part 42 of the repair structure 4 in the pixel unit can be electrically coupled by laser irradiation, and the gray scale voltage written to the first electrode 51 of the light emitting device in the another pixel unit can be written to the first electrode 51 of the light emitting device of the pixel unit where the repair structure 4 is located through the repair structure 4, so that the pixel unit where the repair structure 4 is located can normally emit light.

An embodiment of the present disclosure also provides a method for manufacturing an array substrate, which can be used to manufacture the array substrate in the above embodiments. The method can include following steps 1 to 3.

At step 1, a plurality of pixel units are formed on a base substrate.

At step 2, a repair structure is formed in at least one pixel unit in the plurality of pixel units, a first part of the repair structure is electrically coupled to a first electrode of a light emitting device of the pixel unit where the repair structure is located, and a second part of the repair structure is electrically coupled to a first electrode of a light emitting device in another pixel unit other than the pixel unit where the repair structure is located.

At step 3, an interlayer insulating layer is formed between the first part and the second part of the repair structure.

The first part 41 of the repair structure 4 is electrically coupled to the second part 42 of the repair structure 4 by laser irradiation, the first part 41 of the repair structure 4 is electrically coupled to the first stage 51 of the light emitting device in the pixel unit where the repair structure 4 is located, and the second part 42 of the repair structure 4 is electrically coupled to the first electrode 51 of the light emitting device in another pixel unit other than the pixel unit where the repair structure 4 is located.

According to the method for manufacturing the array substrate of the embodiment, the repair structure 4 is formed in the pixel unit, the first part 41 of the repair structure 4 is electrically coupled to the first stage 51 of the light emitting device in the pixel unit where the repair structure 4 is located, and the second part 42 of the repair structure 4 is electrically coupled to the first electrode 51 of the light emitting device in another pixel unit other than the pixel unit where the repair structure 4 is located. When the driving transistor T2 in the pixel unit has a problem and cannot transmit the gray scale voltage to the first electrode 51 of the light emitting device to drive the light emitting device for display, the first part 41 and the second part 42 of the repair structure 4 in the pixel unit can be electrically coupled by laser irradiation, and the gray scale voltage written to the first electrode 51 of the light emitting device in the another pixel unit can be written into the first electrode 51 of the light emitting device of the pixel unit, where the repair structure 4 is located, through the repair structure 4, so that the pixel unit where the repair structure 4 is located can emit light normally.

In order to more clearly illustrate the method for manufacturing the array substrate of the embodiment, the second part of the repair structure being electrically coupled to the first electrode of the light emitting device in the pixel unit adjacent to the pixel unit (e.g., in the row direction or in the column direction) where the repair structure is located is taken as an example for description.

Following descriptions mainly describe the method for manufacturing the array substrate of the embodiment by describing processes for manufacturing the driving transistor T2, the light emitting device, and the repair structure 4. For example, the driving transistor T2 may be a top gate type thin film transistor, the first electrode 51 of the light emitting device may be an anode, and the second electrode of the light emitting device may be a cathode.

Figure 9:
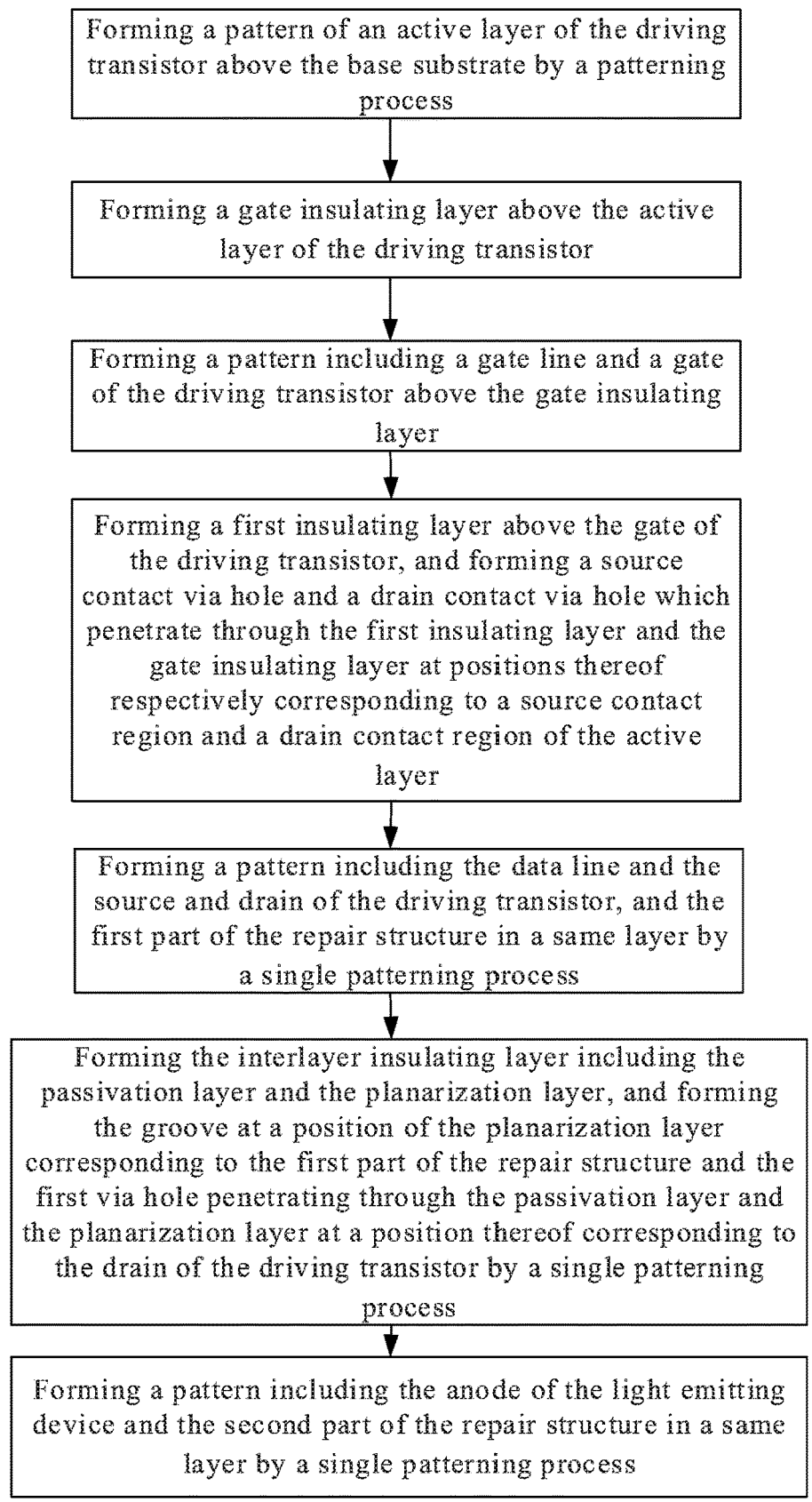
FIG. 9 is a flowchart of a method for manufacturing an array substrate according to an embodiment of the disclosure.

As shown in FIG. 9, the method for manufacturing the array substrate in the embodiment may include following steps 1 to 7.

At step 1, a pattern of an active layer 21 of the driving transistor T2 is formed above the base substrate 10 by a patterning process.

For example, the active layer 21 may be made of material of oxide semiconductor, polysilicon, amorphous silicon, or the like.

At step 2, a gate insulating layer 1 is formed above the active layer 21 of the driving transistor 2.

For example, the gate insulating layer 1 may be a single-layer structure or a multi-layer structure; when the single-layer structure is adopted, the gate insulating layer 1 may be made of silicon nitride or silicon oxide; when the gate insulating layer 1 is the multi-layer structure, it may be made of silicon oxide/silicon nitride.

At step 3, a pattern including a gate line Gate and a gate 22 of the driving transistor T2 is formed above the gate insulating layer 1.

For example, the gate line Gate and the gate 22 of the driving transistor T 2 are formed of material of at least one of molybdenum, molybdenum-niobium alloy, aluminum, aluminum-neodymium alloy, titanium, or copper.

At step 4, a first insulating layer 2 is formed above the gate 22 of the driving transistor T2, and a source contact via hole and a drain contact via hole which penetrate through the first insulating layer 2 and the gate insulating layer 1 at positions thereof respectively corresponding to a source contact region and a drain contact region of the active layer 21 are formed.

For example, the first insulating layer 2 may have a single-layer structure or a multi-layer structure. When the single-layer structure is used, the first insulating layer 2 may be made of silicon nitride or silicon oxide, and when the first insulating layer 2 has the multi-layer structure, it may be made of silicon oxide\silicon nitride.

At step 5, a pattern including the data line Data and the source 23 and drain 24 of the driving transistor T2, and the first part 41 of the repair structure 4 is formed in a same layer by a single patterning process.

For example, two structures being formed in a same layer in the embodiment means that the two structures being formed of a same material layer, the data line Data, the source 23 and the drain 24 of the driving transistor T2, and the first part 41 of the repair structure 4 may be made of material of at least one of molybdenum, molybdenum-niobium alloy, aluminum-neodymium alloy, titanium, or copper.

The patterning process of the embodiment may include, for example, coating, exposure, development, and the like, but is not limited thereto. At step 6, the interlayer insulating layer 3 including the passivation layer 31 and the planarization layer 32 is formed, and the groove 43 at a position of the planarization layer 32 corresponding to the first part 41 of the repair structure 4 and the first via hole 30 penetrating through the passivation layer 31 and the planarization layer 32 at a position thereof corresponding to the drain 24 of the driving transistor T2 are formed by a single patterning process.

For example, the passivation layer 31 and the planarization layer 32 may each have a single-layer structure or a multi-layer structure. Silicon nitride or silicon oxide may be used for forming each of the passivation layer 31 and the planarization layer 32 when the single layer structure is used, and silicon oxide\silicon nitride may be used for forming each of the passivation layer 31 and the planarization layer 32 when the multi-layer structure is used. In the embodiment, a thickness of the planarization layer 32 is approximately in a range from 1 μm to 4 μm.

At step 7, a pattern including the anode of the light emitting device and the second part 42 of the repair structure 4 is formed in a same layer by a single patterning process. The anode of the light emitting device is electrically coupled to the drain 24 of the driving transistor T2 through the corresponding first via hole 30, and the second part 42 of the repair structure 4 is coupled to the anode 51 of the light emitting device in the pixel unit adjacent to the pixel unit where the repair structure 4 is located.

For example, the anode of the light emitting device and the second part 42 of and repair structure 4 may include a film structure of ITO (indium tin oxide)/Ag (silver)/ITO (indium tin oxide) or Ag (silver)/ITO (indium tin oxide); alternatively, ITO in the above structure may be replaced with IZO (indium zinc oxide), IGZO (indium gallium zinc oxide), or InGaSnO (indium gallium tin oxide). Certainly, the anode of the light emitting device and the second part 42 of the repair structure 4 may also be formed by using material of inorganic metal oxide, organic conductive polymer, or a metal, which have conductive properties and a high work function value, the inorganic metal oxide including indium tin oxide or zinc oxide, the organic conductive polymer including PEDOT:SS, PANT, and the metal including gold, copper, silver, or platinum.

The method for manufacturing the array substrate of the embodiment may further include forming a pixel defining layer (PDL), forming an emitting layer (EL) by evaporation or coating, and forming a metal cathode layer by sputtering or evaporation, and then the array substrate with an OLED device or a QLED device is formed by packaging. For example, a thickness of the pixel defining layer may be in a range from 1 μm to 2 μm.

It should be understood that the steps of the method for manufacturing the array substrate of the embodiment of the present disclosure may also be performed in an order different from that described and illustrated.

According to the array substrate manufactured by the method of the embodiment, the pixel unit is provided with the repair structure therein, the first part of the repair structure is electrically coupled to the drain of the driving transistor in the pixel unit where the repair structure is located, and the second part of the repair structure is electrically coupled to the first electrode of the light emitting device in another pixel unit adjacent to the pixel unit where the repair structure is located. When the driving transistor in the pixel unit has a problem and cannot transmit the gray scale voltage to the first electrode of the light emitting device to drive the light emitting device to display, the first part and the second part of the repair structure in the pixel unit can be electrically coupled by means of laser irradiation, and at the moment, the gray scale voltage written to the first electrode of the light emitting device in the pixel unit adjacent to the pixel unit where the repair structure is located can be written to the first electrode of the light emitting device of the pixel unit where the repair structure is located through the repair structure, so that the pixel unit where the repair structure is located can normally emit light.

An embodiment of the disclosure also provides a display apparatus. The display apparatus may include the array substrate in the above embodiment. Since the display apparatus in the embodiment includes the array substrate in the above embodiment, the failure of pixel unit can be repaired.

The display apparatus in the embodiment may include any product or component having a display function, such as an OLED panel, a mobile phone, a tablet computer, a television, a display, a notebook computer, a digital photo frame, and a navigator.

It should be understood that, the above embodiments and implementations are merely exemplary embodiments and implementations for explaining principle of the present disclosure, but the present disclosure is not limited thereto. Various modifications and variants may be made by those ordinary skilled in the art within the spirit and essence of the present disclosure, these modifications and variants fall into the protection scope of the present disclosure.

The invention claimed is:

1. An array substrate, comprising a base substrate and a plurality of pixel units above the base substrate, each of the pixel units comprises a light emitting device, and the light emitting device comprises a first electrode and a second electrode, wherein at least one of the pixel units is provided with a repair structure therein, the repair structure comprises a first part and a second part which are mutually insulated, and the first part and the second part are electrically coupled to each other after being repaired, and wherein
the first part of the repair structure is electrically coupled to the first electrode of the light emitting device in the pixel unit where the repair structure is located, and the second part of the repair structure is electrically coupled to the first electrode of the light emitting device in any one of the pixel units other than the pixel unit in which the repair structure is located,
the pixel unit in which the repair structure is located and the any one of the pixel units other than the pixel unit in which the repair structure is located are coupled to different data lines respectively.

2. The array substrate of claim 1, wherein the pixel unit further comprises a driving transistor, a drain of the driving transistor is coupled to the first electrode of the light emitting device in the pixel unit where the driving transistor is located, and the first part of the repair structure is electrically coupled to the first electrode of the light emitting device in the pixel unit where the repair structure is located, through the drain of the driving transistor.

3. The array substrate of claim 2, wherein the second part of the repair structure is electrically coupled to the first electrode of the light emitting device in the pixel unit adjacent to the pixel unit where the repair structure is located.

4. The array substrate of claim 2, wherein the first part of the repair structure and the drain of the driving transistor in the pixel unit where the repair structure is located are formed as a single piece.

5. The array substrate of claim 1, wherein the second part of the repair structure and the first electrode of the light emitting device in the pixel unit other than the pixel unit where the repair structure is located are formed as a single piece.

6. The array substrate of claim 1, wherein orthographic projections of the first part and the second part of the repair structure on the base substrate at least partially overlap with each other.

7. The array substrate of claim 6, wherein a position where the orthographic projections of the first part and the second part of the repair structure on the base substrate overlap with each other is located in a repair region; and
an interlayer insulating layer is disposed between a layer where the first part is located and a layer where the second part is located.

8. The array substrate of claim 7, wherein the interlayer insulating layer comprises a passivation layer and a planarization layer successively disposed above the base substrate; wherein
the passivation layer is above the layer where the drain of the driving transistor and the first part of the repair structure are located;
a groove is formed in a position, corresponding to the repair region, of the planarization layer, and the groove penetrates through the planarization layer;
a first via hole penetrating through the passivation layer and the planarization layer is formed in positions, corresponding to the drain of the driving transistor, of the passivation layer and the planarization layer;
the first electrode of the light emitting device is coupled to the drain of the driving transistor through the first via hole.

9. The array substrate of claim 1, wherein the light emitting device comprises an OLED device or a QLED device.

10. The array substrate of claim 6, wherein upon repairing by laser irradiation, a channel is formed between overlapping portions of the first part and the second part of the repair structure, and melted portions of the first part and/or the second part of the repair structure are joined together through the channel.

11. A method for manufacturing an array substrate, the method comprising:
forming a plurality of pixel units above a base substrate;
forming a repair structure for at least one of the pixel units, a first part of the repair structure is electrically coupled to a first electrode of a light emitting device in the pixel unit where the repair structure is located, a second part of the repair structure is electrically coupled to a first electrode of a light emitting device in the pixel unit other than the pixel unit where the repair structure is located, and the pixel unit where the repair structure is located and the pixel unit other than the pixel unit where the repair structure is located are coupled to different data lines respectively;
forming an interlayer insulating layer between the first part and the second part of the repair structure,
wherein the first part and the second part of the repair structure are capable of being electrically coupled to each other under irradiation of laser.

12. The method of claim 11, further comprising:
forming a driving transistor above the base substrate,
wherein a drain of the driving transistor is coupled to the first electrode of the light emitting device in the pixel unit where the driving transistor is located, and the first part of the repair structure is electrically coupled to the first electrode of the light emitting device in the pixel unit where the repair structure is located, through the drain of the driving transistor.

13. The method of claim 12, wherein the second part of the repair structure is formed to be electrically coupled to the first electrode of the light emitting device in the pixel unit adjacent to the pixel unit where repair structure is located.

14. The method of claim 13, wherein the second part of the repair structure and the first electrode of the light emitting device in the pixel unit adjacent to the pixel unit where the repair structure is located are formed in a same layer by a single patterning process.

15. The method of claim 11, wherein the first part and the second part of the repair structure are formed so that orthographic projections of the first part and the second part of the repair structure on the base substrate at least partially overlap with each other, and a position where the orthographic projections of the first part and the second part of the repair structure on the base substrate overlap with each other is located in a repair region.

16. The method of claim 15, wherein the interlayer insulating layer comprises a passivation layer and a planarization layer successively disposed above the base substrate, a groove is formed at a position of the planarization layer corresponding to the repair region, and the groove penetrates through the planarization layer, the method further comprises:
- forming the passivation layer above a layer where the drain of the driving transistor and the first part of the repair structure are located; and
- forming the planarization layer above the passivation layer, and etching a via hole at a position of the planarization layer corresponding to the repair region to form the groove.

17. The method of claim 16, further comprising:
- forming a first via hole penetrating through the passivation layer and the planarization layer at positions of the passivation layer and the planarization layer corresponding to the drain of the driving transistor while forming the groove, the first electrode of the light emitting device is electrically coupled to the drain of the driving transistor through the first via hole;
- the groove and the first via hole are formed by a single patterning process.

18. A method for repairing the array substrate of claim 1, and the method comprises:
- determining a pixel unit of the array substrate with display defect; and
- performing laser irradiation on the first part and the second part of the repair structure in the pixel unit with display defect so that the first part and the second part of the repair structure are electrically coupled to each other.

19. The method of claim 18, wherein the performing laser irradiation on the first part and the second part of the repair structure in the pixel unit with display defect so that the first part and the second part of the repair structure are electrically coupled to each other comprises:
- irradiating the first part and the second part of the repair structure in the pixel unit with display defect by laser, to gasify parts between overlapping portions of the first part and the second part of the repair structure, the first part and the second part of the repair structure are melted and joined together through a channel formed by gasification.

20. A display apparatus, comprising the array substrate of claim 1.

* * * * *